US012601786B2

(12) United States Patent
Shareef et al.

(10) Patent No.: US 12,601,786 B2
(45) Date of Patent: Apr. 14, 2026

(54) INTELLIGENT MV AND HV CIRCUIT BREAKER TESTING AND DIAGNOSING UNIT

(71) Applicants: UNITED ARAB EMIRATES UNIVERSITY, Al Ain (AE); TAQA Distribution, Abu Dhabi (AE)

(72) Inventors: Hussain Shareef, Al Ain (AE); Tarik Tayseer Shadid, Al Ain (AE)

(73) Assignees: UNITED ARAB EMIRATES UNIVERSITY, Al Ain (AE); ABU DHABI DISTRIBUTION COMPANY PJSC, Abu Dhabi (AE)

( * ) Notice: Subject to any disclaimer, the term of this patent is extended or adjusted under 35 U.S.C. 154(b) by 8 days.

(21) Appl. No.: 19/098,612

(22) Filed: Apr. 2, 2025

(65) Prior Publication Data

US 2025/0258230 A1 Aug. 14, 2025

Related U.S. Application Data

(63) Continuation-in-part of application No. 17/511,306, filed on Oct. 26, 2021, now abandoned.

(51) Int. Cl.
*G01R 31/327* (2006.01)

(52) U.S. Cl.
CPC ................................. *G01R 31/3277* (2013.01)

(58) Field of Classification Search
None
See application file for complete search history.

(56) References Cited

U.S. PATENT DOCUMENTS

| 5,245,289 A | 9/1993 | Rumfield |
| 6,545,479 B1 | 4/2003 | Dollar et al. |
| | (Continued) | |

FOREIGN PATENT DOCUMENTS

| CN | 101581763 A | 11/2009 |
| CN | 204462337 U | 7/2015 |
| | (Continued) | |

OTHER PUBLICATIONS

Nader; Opening and closing time of high voltage circuit breaker; Quisure; Electrical Supply Chain; Sep. 9, 2020 12:02PM (Year: 2020).*

(Continued)

*Primary Examiner* — Nasima Monsur
(74) *Attorney, Agent, or Firm* — Nath, Goldberg & Meyer; Joshua B. Goldberg

(57) ABSTRACT

A smart circuit breaker tester is provided as a portable system for testing medium-voltage circuit breakers. The system includes a programmable logic controller (PLC), a human-machine interface (HMI), transducers for measuring current and voltage, an impedance tester, a smart power supply for supplying voltages required for testing circuit breakers with related power and safety components, and plug and play and OEM cables for connecting the system to the circuit breaker under test. The PLC is programmed with custom software that reports such testing criteria as closing time and closing drain current, opening time and opening drain current, contact resistance, etc. within about two minutes, and permits testing automatically in sequence or manually one at a time. The system permits testing in situ while the circuit breaker is still connected to the circuit(s) being protected, or when drawn out.

12 Claims, 3 Drawing Sheets

(56) References Cited

U.S. PATENT DOCUMENTS

| 6,815,955 | B1 * | 11/2004 | O'Neal, III | G01R 31/3277 |
| | | | | 324/424 |
| 7,791,346 | B2 | 9/2010 | Waite | |
| 8,493,060 | B1 * | 7/2013 | Mahoney | G01R 19/145 |
| | | | | 340/639 |
| 2006/0279884 | A1 * | 12/2006 | Valdes | H02H 7/30 |
| | | | | 361/42 |
| 2007/0047161 | A1 * | 3/2007 | Mills | G01R 31/3277 |
| | | | | 361/42 |
| 2016/0124048 | A1 | 5/2016 | Ashtekar et al. | |

FOREIGN PATENT DOCUMENTS

| CN | 207440180 | U | 6/2018 |
| CN | 110007223 | A | 9/2019 |
| CN | 110261763 | A | 9/2019 |
| CN | 1105114986 | A | 11/2019 |

OTHER PUBLICATIONS

Jiang et al; A Load Circuit Fault Detection Circuit And Method Applied To Breaker Reclosing; CN103560479B; Date Published Aug. 17, 2016; G01R31/02 (Year: 2016).*
Tian et al; A Socket Type Ground Fault Breaker; CN201289831Y; Date Published Aug. 12, 2009; HO1H83/02 (Year: 2009).*
Jiang, et al., A Load Circuit Fault Detection Circuit adn Method Applied to Breaker Reclosing; CN 103560479 B. Date Published Aug. 17, 2016 G01R31/02 (Year 2016).
Tian, et al., A Socket Type Ground Fault Breaker; CN 201289831 Y; Date Published Aug. 12, 2009; H01H83/02 (Year 2009).

* cited by examiner

INTELLIGENT MV AND HV CIRCUIT BREAKER TESTING AND DIAGNOSING UNIT

RELATED APPLICATION

The present Patent Application is a Continuation in Part of U.S. patent application Ser. No. 17/511,306, filed Oct. 26, 2021, which is assigned to the assignee hereof and filed by the inventors hereof and which is incorporated by reference herein.

BACKGROUND

Technical Field

The disclosure of the present patent application relates to circuit breakers used in power transmission and distribution systems, and particularly to a smart circuit breaker tester providing a diagnostic apparatus including an onboard diagnostic feature for performing diagnostic testing on circuit breakers, such as high-voltage power circuit breakers.

Background Art

Electrical power transmission and distribution systems typically utilize a plurality of power circuit breakers, which include one or more sets of separable contacts for protecting circuits against overcurrent conditions. In the field, a number of such circuit breakers are generally mounted and housed within a non-conductive housing or enclosure, often referred to as a switchgear enclosure. Power connections for the circuit breakers are generally terminated in the rear of the enclosure, and instrumentation and control terminal blocks for the circuit breakers may either be mounted in the rear or the front of the enclosure. In many cases, switchgear equipment as just described is provided in a drawout configuration wherein the circuit breakers may be completely removed from the front of the switchgear enclosure for repair, testing or maintenance. In other cases, the circuit breakers are mounted on customized framework, generally called a fixed breaker, and may not be able to be racked out of the framework.

The electrical power transmission and distribution industry has a huge installed base of power circuit breakers. Many of the circuit breakers have been in the field for a long time and are still completely operational. These older circuit breakers, unlike many more modern circuit breakers, do not have any built-in diagnostic sensors for monitoring the operation thereof. If such a circuit breaker fails, the customer typically immediately replaces the failed circuit breaker with a spare circuit breaker available on site and transfers the failed circuit breaker to a remote maintenance site for diagnostic testing and repair.

Many of the circuit breakers in the electrical power and distribution industry are what are known as drawout circuit breakers. Drawout circuit breakers often include a mechanism for moving the breaker in and connecting the breaker to corresponding electrical contacts, a location known as the "racked-in" position. When in the racked-in position, the circuit breaker is coupled to the main electrical circuit and provides the interruption functionality for which it is intended. If the drawout mechanism is activated to a "racked-out" position, the circuit breaker is disconnected from the electrical contacts and the main electrical circuit. The circuit breaker may be moved to the racked-out position, for example, when maintenance is performed on the main electrical circuit. Typical racking mechanisms often include a third or "test" position in-between the "racked in" or "Connected" position and "Racked out" or "Disconnected" position. In the test position the circuit breaker can be closed, opened, or tripped in order to check the functionality of the circuit breaker by evaluating proper operation of the internal and external accessories, such as auxiliary switches, shunt trip and under voltage, and secondary circuits.

Diagnostic testing and repair at such a remote maintenance site often makes the diagnosis of the real problem more difficult, since the circuit breaker will often have to be tested without electrical control power due to the unavailability of a proper fixture, such as switchgear enclosure, testing cabinet, etc. In addition, on-call service Engineers or maintenance staff at the customer's site may face problems understanding the breaker mechanism and may not be able to repair the issue due to lack of knowledge and/or sensor diagnostic data. Thus, there is a need for a diagnostic device that can easily and readily interact with the circuit breaker, under drawout or fixed configurations, as discussed above, and provide onboard diagnostic information. In the case of a drawout breaker, it is also often necessary to analyze the breaker functioning under switchgear control signals, giving rise to at least three modes of diagnostic protocol, including, but not limited to, online, semi-online, and offline modes.

Further, the time constraints at maintenance shops due to the cost associated with the downtime or maintenance itself are significant. This creates a need for quick guidance as to the appropriate and accurate repair instructions further to the on-board diagnostic indications. This is needed to further improve the service efficiency for the breaker failure event. This requires an automated diagnostic and repair methodology to be implemented in a new device that can be used for circuit breaker testing. Thus, a smart circuit breaker tester solving the aforementioned problems is desired.

SUMMARY

The smart circuit breaker tester is a portable system for testing medium-voltage circuit breakers. The system includes a programmable logic controller (PLC), a human-machine interface (HMI), transducers for measuring current and voltage, an impedance tester, a smart power supply for supplying voltages required for testing circuit breakers with related power and safety components, and plug and play and OEM cables for connecting the system to the circuit breaker under test. The PLC is programmed with custom software that reports such testing criteria as closing time and closing drain current, opening time and opening drain current, contact resistance, etc. within about two minutes, and permits testing automatically in sequence or manually one at a time. The system permits testing in situ while the circuit breaker is still connected to the circuit(s) being protected, or when drawn out.

The smart circuit breaker tester may be used for power control systems, by way of non-limiting example, for use with power station/plant feeders to evaluate vacuum circuit breaker (VCB) or air circuit breaker (ACB) contacts. A programmable logic controller (PLC) has at least one plug and play connector adapted for connection to a circuit breaker under test. The programmable logic controller has input circuits including a current transducer and a resistance measuring circuit disposed between the plug and play connector and the programmable logic controller for receiving response signals from the circuit breaker. Output circuits are provided, including relays for sending signals to the circuit breaker under test initiating circuit breaker testing. The testing may include an opening time and testing an opening drain current, a closing time and testing a closing drain current, and measuring a contact resistance and a spring charging current. A human-machine interface is connected to, or connectable with, the programmable logic controller. The human-machine interface has a display and a data input adapted for receiving data and commands from a user for input to the programmable logic controller.

The opening time is defined as a time interval between when a smart circuit breaker open command is activated to when a circuit breaker status feedback input is deactivated. In response to the open command being activated, a first relay is energized, causing contacts of a positive terminal of a power supply and contacts of a negative terminal of the power supply to both close. The closing of these contacts allows opening drain current to pass through the circuit breaker opening coil via a secondary contact block and a current transducer, and a spring is released to return the contacts back to a desired position. The current transducer measures the circuit breaker opening drain current required during an opening operation and provides a 4-20 mA output to the PLC.

In response to the closing command being activated, a second relay is energized, contacts of a positive terminal of a power supply and contacts of a negative terminal of the power supply are both closed which allows the closing drain current to pass through the circuit breaker closing coil via the secondary contact block and a current transducer, and a spring is released to close the circuit breaker. The current transducer measures the circuit breaker closing current required during a closing operation and provides a 4-20 mA output to the programmable logic controller.

The opening drain current is defined as a current drawn by a circuit breaker opening coil or drained through a second contact block from a circuit breaker tester power supply unit when an open command is activated. The closing time is defined as a time interval between a smart circuit breaker close command is activated to when the circuit breaker status feedback input is activated. The closing drain current is defined as a current drawn by a circuit breaker closing coil or drained through the second contact block from the circuit breaker tester power supply unit when a closing command is activated. The contact resistance is defined as a resistance to a current flow when vacuum circuit breaker or air circuit breaker contacts touch one another in a closed condition The spring charging current is defined as a current drawn by a spring motor in the circuit breaker to charge springs.

These and other features of the present subject matter will become readily apparent upon further review of the following specification and drawings.

BRIEF DESCRIPTION OF THE DRAWINGS

Similar reference characters denote corresponding features consistently throughout the attached drawings.

DETAILED DESCRIPTION

Figure 1:
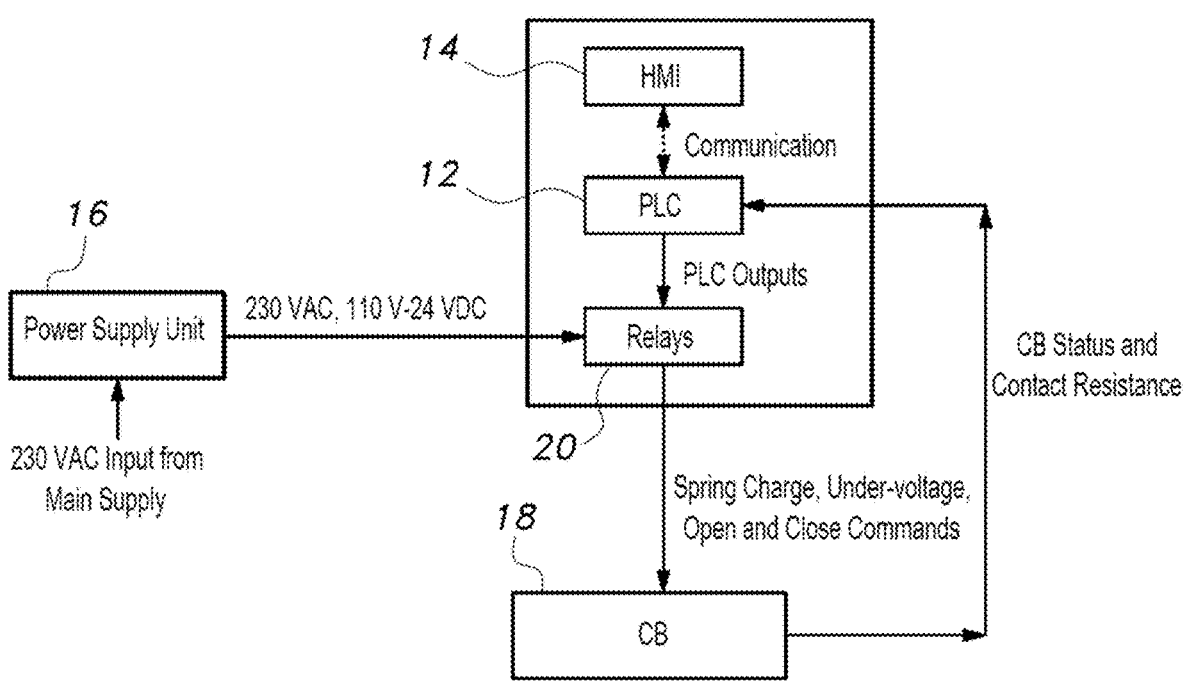
FIG. 1 is a simplified block diagram of a smart circuit breaker tester, showing communication between the components of the test and a circuit breaker under test.

The smart circuit breaker tester is a portable system for testing medium-voltage circuit breakers. The system includes a programmable logic controller (PLC), a human-machine interface (HMI), transducers for measuring current and voltage, an impedance tester, a smart power supply for supplying voltages required for testing circuit breakers with related power and safety components, and plug and play and OEM cables for connecting the system to the circuit breaker under test. The PLC is programmed with custom software that reports such testing criteria as closing time and closing drain current, opening time and opening drain current, contact resistance, etc. within about two minutes, and permits testing automatically in sequence or manually one at a time. The system permits testing in situ while the circuit breaker is still connected to the circuit(s) being protected, or when drawn out.

As used herein, the term "low-voltage circuit breaker" means a circuit breaker designed for circuits that normally carry up to 1,000V. The term "medium-voltage circuit breaker" refers to circuit breakers designed for circuits that normally carry between 1 kV and 72 kV. The term "high-voltage circuit breaker" refers to circuit breakers designed for circuits that normally carry over 72.5 kV. These terms should be distinguished from the normal operating voltage of the circuit breaker and its component circuits.

Circuit breakers perform a vital role in protecting expensive equipment from damage due to faults. If the circuit breakers fail to operate in the intended manner and predefined time, the distribution system components and service may be disrupted. Therefore, the proper operation of circuit breakers must be assured during the service life of the device. For this purpose, rigorous field testing during installation and regular maintenance are inevitable to prevent costly failures and problems that could even compromise the safety of the substation. A typical circuit breaker testing procedure usually requires substantially long time (>30 minutes), and only a very few highly qualified and specifically trained personnel can correctly perform circuit breaker testing, which often involves decrypting complicated connections and following stringent safety procedures during the procedure.

In addition, the customers face service interruption for a long time during circuit breaker testing in the substations. Therefore, the smart circuit breaker tester (including both software and hardware) is designed to reduce testing time and the power interruption interval to a maximum of 2 minutes, while still meeting the safety requirements of personnel and equipment. To achieve these requirements, plug and play connectors, user-friendly human-machine interfaces (HMI), and automated testing algorithm (auto and manual) type of circuit breaker selection steps are integrated as a system. The plug and play connectors avoid connection complexity and un-racking of the circuit breaker, and reduce connection time.

The circuit breaker (CB) is an important device that interrupts current when electrical faults occur. If the device fails to operate properly during a fault condition, the entire electrical system can be at risk. Technicians should regularly test for potential problems so that the circuit breakers can be verified to operate according to their intended design. Regular maintenance practices provide the opportunity to identify and correct operational issues and ensure power system reliability. Circuit breaker testing allows technicians to detect problems in the circuit breaker. The smart circuit breaker tester is designed to test the dynamic characteristics of various circuit breaker models. It is a multi-purpose circuit breaker tester that can be used for both medium-voltage (MV) or high-voltage (HV) types. It allows quick and rapid circuit breaker testing with fewer operational mistakes. It has plug and play connectors to make the circuit breaker connection easy and safe. It utilizes a programmable logic controller (PLC)-based control unit, which incorporates a digital memory to store the test records. RFID, Wi-Fi, and Bluetooth options in the tester enable it to easily retrieve the OEM data sheet in the future. Finally, the designed tester allows tests to be performed during the in-service, test without requiring that the circuit breaker be racked out.

The smart circuit tester may have the following features: a plug and play circuit breaker socket set to reduce connection complexity, an Interlock safety feature to prevent damage and ensure safety of the operator, an automated circuit breaker testing procedure with HMI to provide a circuit breaker status in less than two minutes, to provide recommendation for circuit breaker maintenance and remedial action to be implemented, to provide manual and automatic testing options, and finally, to store data for circuit breaker condition monitoring.

As shown in FIG. 1, the smart circuit breaker tester, designated generally as 10 in the drawings, may include a programmable logic controller (PLC) 12 connected to a human-machine interface (HMI) 14, preferably a touch-screen monitor or similar device. The tester 10 may utilize a dedicated regulated power supply 16 capable of converting an AC power mains voltage to the operational voltages required by the tester 10 and the circuit breaker 18 under test in order to make the tester portable and perform the tests selected without undue interference of the operation of the circuit breaker 18. The power supply 16 may supply the required voltages, as well as signals initiating the desired tests (such as spring charge, undervoltage, opening and closing times and drain voltages, etc.) from the PLC 12, to the circuit breaker 18 through relays 20 for circuit isolation and protection. In return, the circuit breaker 18 may supply output signals from the tests, as well as other data related to performance (circuit breaker status, contact resistance, etc.) directly to the PLC 12.

Figure 2:
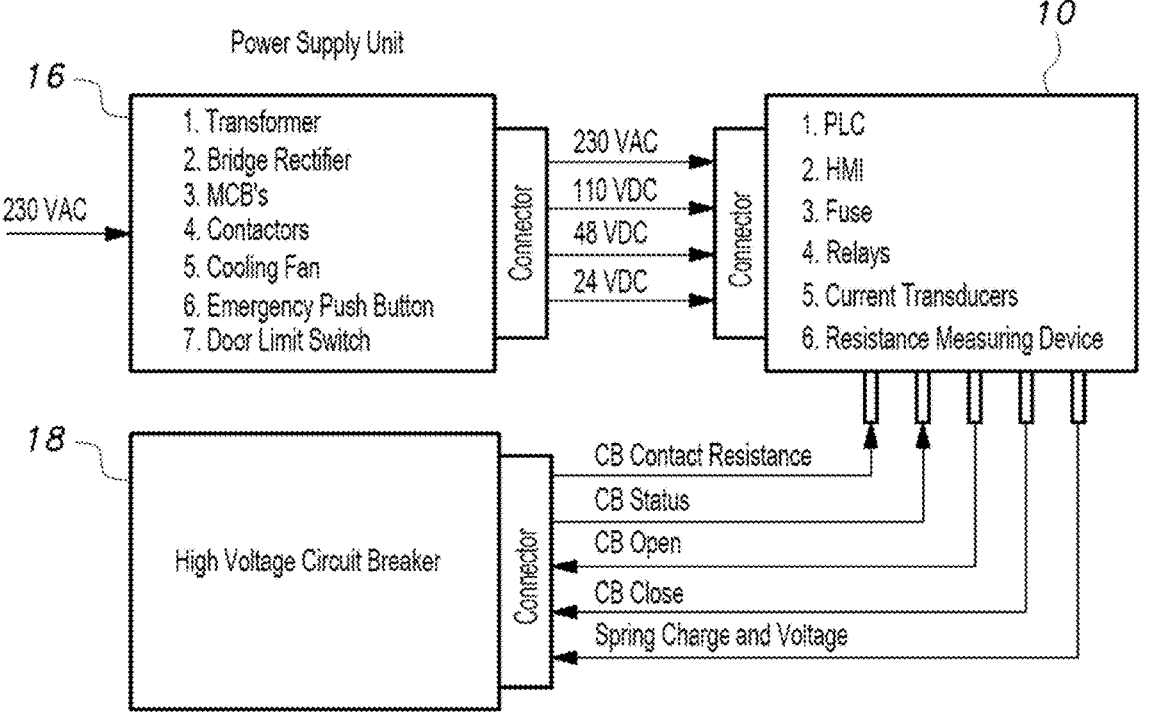
FIG. 2 is a block diagram of a smart circuit breaker tester, showing a more detailed flow of signals between the tester's power supply, the main body of the tester, and a circuit breaker under test.

As shown in more detail in FIG. 2, the power supply module 16 used with the smart circuit breaker tester 10 may include a transformer, a bridge rectifier, miniature circuit breakers (MCBs), contacts, a cooling fan, an emergency push button, and may be packed in a case having a door limit switch. The power supply module 16 may supply a full-voltage for powering the circuit breaker under test, such as 230 VAC or 120 VDC, or lower voltages required by the tester 10 or the components of the circuit breaker 18 being tested. The tester 10 may include the PLC 12, the HMI 14, one or more fuses of relays 20, current transducers, and a resistance or impedance measuring circuit or device. The tester 10 may send signals or voltages to the circuit breaker 18 under test for testing opening and closing the poles of the circuit breaker 18 or for measuring spring charge and undervoltage and receive data regarding circuit breaker contact resistance and circuit breaker status through cables with plug and play plugs or connectors, either custom made for the tester 10 or conventional plug and play cables made or provided by the OEM for fast and mistake-proof connection of the tester 10 with the circuit breaker 18.

Figure 3:
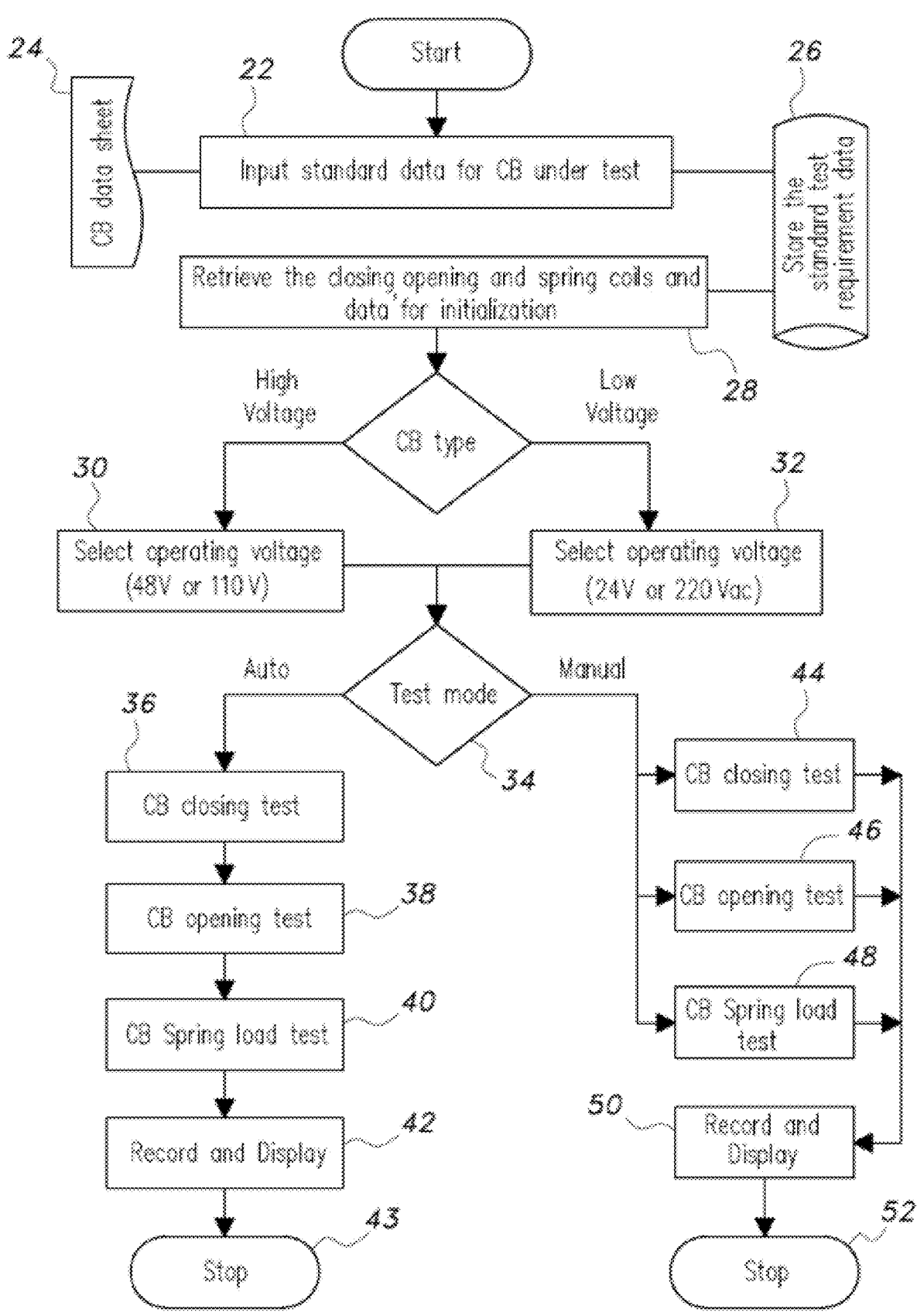
FIG. 3 is a high level flowchart of software programmed into the smart circuit breaker tester's programmable logic controller, showing overall program flow.

The programmable logic controller (PLC) 12 may be programmed with software offering the user some options for controlling how the circuit breaker 18 will be tested and for displaying the test results using the HMI 14, which may be a touch screen monitor, for example. Exemplary software flow is shown in FIG. 3. At step 22, the specifications for the circuit breaker 18 under test are input to the PLC 12, either manually from a circuit breaker data sheet (step 24) or by download from a database if the tester 10 is connected to the Internet by WiFi or by Bluetooth connection to a database via smart phone or the like. Data from either source may be saved or stored on the PLC 12 (step 26) and then data required by the testing is retrieved and used to initialize the software to begin testing (step 28). Based on the circuit breaker type and the nature of the test, a high operating voltage (step 30) or a low or medium operating voltage (step 32) may be selected. The user may select the test mode (step 34), which may be automatic or manual.

When automatic testing is selected, the PLC 12 automatically generates signals for circuit breaker closing tests (step 36) (measuring closing time and closing drain current), circuit breaker opening tests (step 38) (opening times and opening drain current), and circuit breaker load testing (step 40) in sequence, followed by recording and displaying the results (step 42), whereupon testing stops (step 43). When manual testing is selected, the user may manually select when to start each test (steps 44, 46, 48, respectively) and may select when to record and display the results (50), and to terminate testing (step 52).

The algorithm code starts with accepting a standard technical data sheet for the circuit breaker 18 under test. Options are provided in the HMI 14 to obtain the data manually or automatically by selecting the model of the circuit breaker 18 under the test. Then these data are stored in the programmable logic controller (PLC) 12 in the developed testing unit. Based on the type of circuit breaker (medium-voltage (MV) or high-voltage (HV)), the user will be asked to select the operating voltage of the circuit breaker 18 (available options in the develop test are 48V and 110V for HV and 24V and 220V for MV). Once a suitable voltage is selected via interlock and safety check in the program code, the user is directed to select an option for manual or automatic test processes.

In the automatic test process, signals are sent to closing, opening and spring loading activation coils sequentially in steps. During this process, the closing drain current, opening drain current along with time related closing and opening times are calculated within the program using current transducers used in the circuit breaker testing unit 10. The measured data are then compared with the standard test data provided at the initial setting stage. If the measured data are within the acceptable range, the circuit breaker 18 passes the test. Otherwise, some remedial measure or maintenance is required. With this algorithm, the circuit breaker testing can be completed within few minutes. A medium-voltage circuit breaker (CB) testing algorithm was developed by using GE-proficiency machine Edition V6.5 to test the operation of a circuit breaker automatically or manually via the human-machine interface (HMI) 14. The algorithm used four factors to determine the status of the circuit breakers as follows: closing time in ms, opening time in ms, closing drain current, and opening drain current.

The second option provided to the user is the manual actuation of opening and closing tests of the circuit breaker 18. The main difference in this part of the program is manual activation of the sequential process. For example, once the circuit breaker opening test is selected by the user, the program allows only to perform operation of circuit breaker opening and data recording. The whole algorithm flowchart is shown in FIG. 3, as described above.

The smart circuit breaker tester 10 is an intelligent system that helps to judge the circuit breaker's internal status and aids the technician to predict the future expected faults or requirements for circuit breaker maintenance. It allows quick and rapid circuit breaker testing with very limited operational mistakes. It also has a smart power supply unit 16 that is required for various circuit breakers 18 having different levels of DC and AC voltages. This power supply 16 makes the connections easier and safer for the operator and the equipment. Besides, the test kit comes with the plug and play cables and dedicated plug to help the operator to connect circuit breakers 18 quicker than any other circuit breakers testing device, with no mistakes.

Meanwhile, software interlock and safety devices adopted in the circuit breaker testing unit 10 and power supply unit 16 avoid mistakes in selecting suitable voltage levels when testing different brands of circuit breakers. The interlock system and safety devices include a limit switch and a proximity switch to prevent the hazard of live circuits inside the Testing Kit, an emergency push button to isolate the testing unit 10 on the spot, fuse protection in case of wrong selections, and popup warning messages to ensure the proper selection.

Moreover, it has the Windows®-based human-machine interface (HMI) 14 with in-built program code and algorithms to perform the circuit breaker testing automatically and manually. The developed software, together with the necessary hardware and transducers, initially accumulates the standard circuit breaker data from the circuit breaker manufacturer's datasheet and various test parameters, such as circuit breaker closing time, opening time, etc. This is necessary during the testing process to judge the status or the condition of the tested circuit breaker 18 and provide recommendation to the operator about corrective circuit breaker maintenance. The developed smart circuit breaker tester 10 includes two main parts and the circuit breaker 18 under test, as shown in FIG. 1.

Initially, the power supply unit 16, circuit breaker testing unit 10, and the circuit breaker 18 under test are connected according to the diagrams shown in FIGS. 1 and 2. The circuit breaker testing unit 10 is the heart of the overall system, and includes a programmable logic controller (PLC) 12 and input/output ports that control the specified relays 20 and contacts associated with the power supply unit 16. In addition, the testing unit 10 receives the information through the transducers and other analog inputs to perform necessary processes and calculations to determine the status and condition of the circuit breaker 18 under test. Various options and steps in testing provided by the system are interfaced with the HMI 14, as described before in the software development section.

The developed testing algorithm further reduces the testing time by allowing automatic sequential testing based on the type of circuit breaker 18 under test. The smart circuit breaker tester 10 provides required information, such as circuit breaker opening/closing time, contact resistance, coil currents, etc. This information is intelligently linked to judge on the circuit breaker's condition and desired maintenance, and predict future faults that may occur. The obtained data and information can be stored in a common database to monitor the circuit breaker's performance during its life cycle and apply preventive maintenance.

To demonstrate and validate the performance of the smart circuit breaker tester, three types of vacuum circuit breakers (VCB) from different manufacturers were selected for testing. The selected circuit breaker models were the ABB/VD4 1206-31, the Mitsubishi/10-VPR-25B, and the HS/VMV12. Once the circuit breakers to test are selected, the experiments were set up as shown in FIGS. 1 and 2. Then, by considering normal circuit breaker testing intervals in practice, each circuit breaker 18 was tested once (four repeated tests in the time of testing) in every three months for a duration of one year. After each test, the data recorded in the prototype smart circuit breaker tester 10 were retrieved. Table 1 shows the circuit breaker opening time performance. As shown in Table 1, circuit breakers that remained for a long period (three months) in static conditions take a longer time to operate and do not comply with the manufacturer's specified time. However, after repeating the test three times, the operation time reduces and was found to comply with the manufacturer's data sheet for all three tested circuit breakers. This test result suggests that circuit breakers should not be left without maintenance for a long time.

TABLE 1

| Results obtained from various circuit breakers under test | | | | | |
|---|---|---|---|---|---|
| | Test interval | Response open trip results (ms) | | | |
| CB model | (months) | 1st | 2nd | 3rd | 4th |
| ABB/VD4 | 3 | 65 | 50 | 50 | 48 |
| 1206-31 | 6 | 75 | 60 | 50 | 49 |
| | 12 | 85 | 65 | 50 | 49 |
| Mitsubishi/10- | 3 | 50 | 45 | 50 | 40 |
| VPR-25B | 6 | 91 | 60 | 50 | 41 |
| | 12 | 110 | 65 | 50 | 40 |
| HS/VMV12 | 3 | 64 | 55 | 51 | 50 |
| | 6 | 72 | 60 | 52 | 50 |
| | 12 | 92 | 65 | 52 | 50 |

Operation

Programmable logic controller (PLC) 12 has input circuits including a current transducer and a resistance measuring circuit. The resistance measuring circuit is disposed between the plug and play connector and the PLC 12 for receiving response signals from the circuit breaker 18 under test and output circuits including relays 20 for sending signals to the circuit breaker 18 under test. This initiates circuit breaker testing including an opening time and testing an opening drain current, a closing time and testing a closing drain current, and measuring a contact resistance and a spring charging current.

The opening time is defined as a time interval between when a smart circuit breaker open command is activated to when a circuit breaker status feedback input is deactivated. In response to open command being activated, a first relay is energized. In response to the energizing of the first relay, contacts of a positive terminal of a power supply 16 and contacts of a negative terminal of the power supply 16 are both closed. The closing of the contacts allows opening drain current to pass through a circuit breaker opening coil via a secondary contact block and a current transducer, and a spring is released to return the contacts back to a desired position.

The current transducer measures the circuit breaker opening drain current required during an opening operation and provides an output to the PLC 12. By way of non-limiting example the output to the PLC 12 is at a low current, for example 4-20 mA.

In response to a closing command being activated, a second relay is energized, and contacts of a positive terminal of a power supply 16 and contacts of a negative terminal of the power supply 16 are both closed. This allows the closing drain current to pass through the circuit breaker closing coil via a secondary contact block and a current transducer, and a spring is released to close the circuit breaker 18. The current transducer measures the circuit breaker closing current required during a closing operation and provides the output to the PLC 12.

Figure 4:
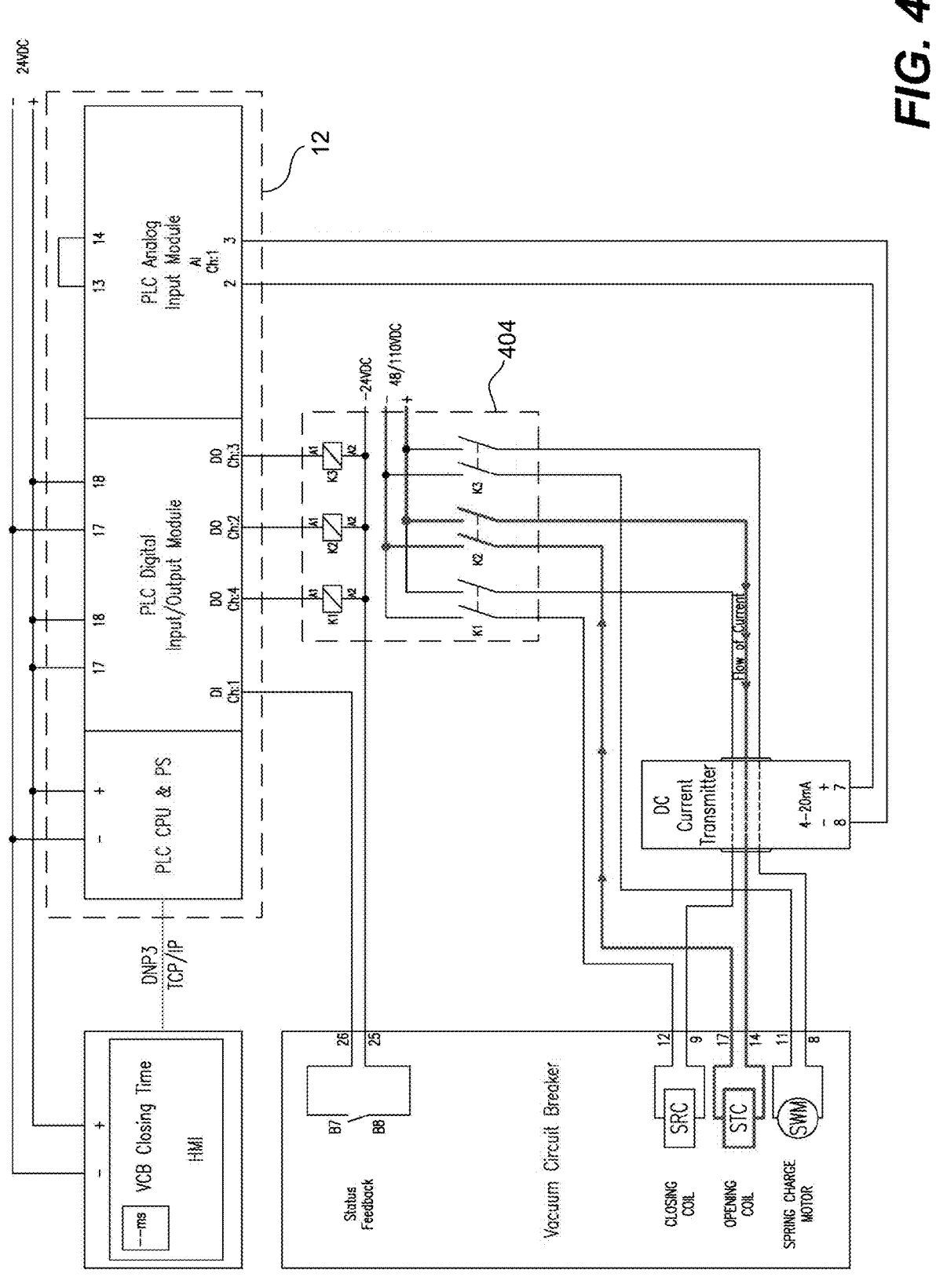
FIG. 4 is a schematic diagram showing a functional implementation of the disclosed technique.

FIG. 4 is a schematic diagram showing a functional implementation of the disclosed technique used in a middle-voltage (MV) or "off-grid" residential power system. The configuration and voltages are given by way of non-limiting example. In this example, relay bank 404 includes relays K1, K2, K3, K4. Relays K1, K2, K3, K4 are activated at a primary side, indicated as 24 VDC and control contacts on the secondary side, indicated at 48/100 VDC.

Initially, when programmable logic controller (PLC) 12 gives the circuit breaker close command, relay K1 is energized to close contacts in K1 by activation on the primary side. At the same time, this also allows the current (also referred to as closing drain current) to pass through circuit breaker closing coil via the secondary contact block and the current transducer (TDHA module) and releases the spring to close the circuit breaker. The transducer measures the circuit breaker closing current which is required for the closing operation and provides 4-20 mA output to an analog input of PLC 12. PLC 12 stores this information for comparison with standard values and also sent this information to HMI through DNP3 TCP/IP communication protocol for display purposes.

During the same operation, once the close command is activated, a timer clock count is initiated in PLC 12. The clock count is stopped when circuit breaker status feedback input is activated after the circuit breaker is fully closed. Therefore, the time interval between circuit breaker close command activation to circuit breaker status feedback input is activated is considered as the closing time. PLC 12 also stores this information for comparison with standard values and also sent this information to HMI through DNP3 TCP/IP communication protocol for display purposes.

The measuring process initiated upon circuit breaker opening current is initiated following the circuit breaker close command. When PLC 12 gives the circuit breaker close command, relay K2 will be energized. Contacts are energized to close contacts in K2 by activation on the primary side. At the same time, this also allows the current, also referred to as opening drain current, to pass through circuit breaker opening coil via the secondary contact block and the current transducer (TDHA module) and releases the spring to return the contact back to the quiescent position. The transducer measures the circuit breaker opening current which is required for the opening operation and provides 4-20 mA output to the analog input of PLC 12. PLC 12 stores this information for comparison with standard values and also sent this information to HMI through DNP3 TCP/IP communication protocol for display purposes.

During the same operation, once the circuit breaker open command, a timer clock count initiates a time count in PLC 12. The count is stopped when circuit breaker status feedback input is deactivated after the contact returned is fully returned to its quiescent position. The time interval between circuit breaker opening command activation to circuit breaker status feedback input is deactivated is considered as the opening time. PLC 12 also stores this information for comparison with standard values and also sent this information to HMI through DNP3 TCP/IP communication protocol for display purposes.

The circuit breaker spring charge current is measured when PLC 12 gives the circuit breaker open command, causing relay K3 to be energized. Contacts are energized to close contacts in K3 by activation on the primary side. At the same time, this also allows the current to pass through the circuit breaker spring charge coil, also referred to as spring charging drain current, and the current transducer (TDHA module). The transducer measures the circuit breaker opening current and provides 4-20 mA output to the analog input of PLC 12. PLC 12 stores this information for comparison with standard values and also sent this information to HMI through DNP3 TCP/IP communication protocol for display purposes.

Circuit breaker contact resistance is measured when PLC 12 gives the circuit breaker contact resistance command, causing relays K1 and K4 to be energized. Contacts are energized to close contacts in K1 and K4 by activation on the primary side. This activates the resistance voltage measurement circuit (PCB) which has-voltage applied across contact under measurement and current passing through the contact. Based on Ohm's Law, it calculates the contact resistance using a voltage divider circuit which outputs 0-100 mV. This output is fed to an amplifier circuit and transducer, which converts the received output to 4-20 mA scaled for the analog input of PLC 12. PLC 12 stores this information for comparison with standard values and also sent this information to HMI through DNP3 TCP/IP communication protocol for display purposes. Contact resistance can be easily calculated when the VCB or ACB is in a racked-out position.

Closing Statement

It is to be understood that the smart circuit breaker tester is not limited to the specific embodiments described above but encompasses any and all embodiments within the scope of the generic language of the following claims enabled by the embodiments described herein, or otherwise shown in the drawings or described above in terms sufficient to enable one of ordinary skill in the art to make and use the claimed subject matter. It will be understood that many additional changes in the details, materials, steps and arrangement of parts, which have been herein described and illustrated to explain the nature of the subject matter, may be made by those skilled in the art within the principle and scope of the invention as expressed in the appended claims.

What is claimed is:

1. A smart circuit breaker tester for use with power station/plant feeders to evaluate vacuum circuit breaker/air circuit breaker (VCB/ACB) contacts, comprising:

a programmable logic controller having at least one plug and play connector adapted for connection to a circuit breaker under test, the programmable logic controller having input circuits including a current transducer and a resistance measuring circuit disposed between the plug and play connector and the programmable logic controller for receiving response signals from the circuit breaker under test and output circuits including relays for sending signals to the circuit breaker under test initiating circuit breaker testing including an opening time and testing an opening drain current, a closing time and testing a closing drain current, and measuring a contact resistance and a spring charging current;

a human-machine interface connected to the programmable logic controller, the human-machine interface having a display and a data input adapted for receiving data and commands from a user for input to the programmable logic controller, wherein the opening time is defined as a time interval between when a smart circuit breaker open command is activated to when a circuit breaker status feedback input is deactivated, wherein in response to said open command being activated, a first relay is energized, causing contacts of a positive terminal of a power supply and contacts of a negative terminal of said power supply to both close, thereby allowing said opening drain current to pass through said circuit breaker opening coil via a secondary contact block and a current transducer, and a spring is released to return the contacts back to a desired position, wherein said current transducer measures the circuit breaker opening drain current required during an opening operation and provides a 4-20 mA output to the programmable logic controller, wherein the opening drain current is defined as a current drawn by a circuit breaker opening coil or drained through the secondary contact block from a circuit breaker tester power supply unit when an open command is activated, wherein the closing time is defined as a time interval between a smart circuit breaker test unit command is activated to when the circuit breaker status feedback input is activated, wherein the closing drain current is defined as a current drawn by a circuit breaker closing coil or drained through the second contact block from the circuit breaker tester power supply unit when a closing command is activated, wherein in response to said closing command being activated, a second relay is energized, contacts of a positive terminal of a power supply and contacts of a negative terminal of said power supply are both closed which allows said closing drain current to pass through said circuit breaker closing coil via the secondary contact block and a current transducer, and a spring is released to close the circuit breaker, wherein said current transducer measures the circuit breaker closing current required during a closing operation and provides a 4-20 mA output to the programmable logic controller, wherein the contact resistance is defined as a resistance to a current flow when vacuum circuit breaker or air circuit breaker contacts touch one another in a closed condition of the smart circuit breaker tester, and wherein the spring charging current is defined as a current drawn by a spring motor in the circuit breaker to charge springs.

2. The smart circuit breaker tester according to claim 1, wherein said human-machine interface comprises a touchscreen monitor.

3. The smart circuit breaker tester according to claim 2, further comprising a portable regulated power supply between said programmable logic controller and the circuit breaker under test through said relays, the power supply being configured for supplying operating voltages to power the circuit breaker under test and voltages for testing components of the circuit breaker under test involved in particular tests being conducted, whereby the smart circuit breaker tester is a portable system.

4. The smart circuit breaker tester according to claim 3, wherein said operating voltages include 230 VAC, 110 VDC, 48 VDC, and 24 VDC.

5. The smart circuit breaker tester according to claim 3, wherein said power supply further comprises an emergency stop button and a limit switch configured to protect the smart circuit breaker tester and the circuit breaker under test.

6. The smart circuit breaker tester according to claim 3, wherein said programmable logic controller is configured to receive data sheet specifications for the circuit breaker under test, to store the specifications in memory, to retrieve the specifications from memory, and to initialize testing procedures with specifications from the data sheet for tests to be conducted on the circuit breaker under test.

7. The smart circuit breaker tester according to claim 3, wherein said programmable logic controller is configured to offer the user an option on the display of said human-machine interface to select between testing a circuit breaker having a high operating voltage and a circuit breaker having a low operating voltage, to receive the user's selection input through said human-machine interface, and to supply the user's selection through the relays and the plug and play connector.

8. The smart circuit breaker tester according to claim 3, wherein said programmable logic controller is configured to offer the user an option on the display of said human-machine interface to select between automatically activating a sequence of tests on the circuit breaker under test and manually activating the sequence of tests on the circuit breaker under test, and to receive the user's selection entered on said human-machine interface.

9. The smart circuit breaker tester according to claim 8, wherein the sequence of tests includes opening time and opening drain current testing, closing time and closing drain current testing, and measuring the contact resistance and the spring charging current.

10. The smart circuit breaker tester according to claim 9, wherein said programmable logic controller is configured to automatically send signals to the circuit breaker under test to perform the tests in the sequence of tests sequentially, to receive and store results of each of the tests in memory, and to display the results of the tests on said human-machine interface when the user selects automatically activating the sequence of tests.

11. The smart circuit breaker tester according to claim 9, wherein said programmable logic controller is configured to prompt the user on said human-machine interface to select starting each of the tests in the sequence of tests sequentially, to send signals to the circuit breaker under test to perform the tests in the sequence of tests as the user selects starting the test, respectively, to receive and store results of each of the tests in memory, and to display the results of the tests on said human-machine interface as each of the tests is completed.

12. A smart circuit breaker tester for use with power station/plant feeders to evaluate vacuum circuit breaker/air circuit breaker (VCB/ACB) contacts, comprising:

a programmable logic controller having at least one plug and play connector adapted for connection to a circuit breaker under test, the programmable logic controller having input circuits including a current transducer and a resistance measuring circuit disposed between the plug and play connector and the programmable logic controller for receiving response signals from the circuit breaker under test and output circuits including relay means for sending signals to the circuit breaker under test initiating circuit breaker testing including an opening time and testing an opening drain current, a closing time and testing a closing drain current, and measuring a contact resistance and a spring charging current;

human-machine interface means operatively connected to the programmable logic controller, the human-machine interface means having a display and a data input adapted for receiving data and commands from a user for input to the programmable logic controller, wherein the opening time is defined as a time interval between when a smart circuit breaker open command is activated to when a circuit breaker status feedback input is deactivated, wherein in response to said open command being activated, a first relay function is energized, contacts of a positive terminal of a power supply and contacts of a negative terminal of said power supply are both closed which allows said opening drain current to pass through said circuit breaker opening coil via a secondary contact block and a current transducer, and a spring is released to return the contacts back to a desired position, wherein said current transducer measures the circuit breaker opening drain current required during an opening operation and provides a 4-20 mA output to the programmable logic controller, wherein the opening drain current is defined as a current drawn by a circuit breaker opening coil or drained through the second contact block from a circuit breaker tester power supply unit when an open command is activated, wherein the closing time is defined as a time interval between a smart circuit breaker close command is activated to when the circuit breaker status feedback input is activated, wherein the closing drain current is defined as a current drawn by a circuit breaker closing coil or drained through the secondary contact block from the circuit breaker tester power supply unit when a closing command is activated, wherein in response to said closing command being activated, a second relay function is energized, contacts of a positive terminal of a power supply and contacts of a negative terminal of said power supply are both closed which allows said closing drain current to pass through said circuit breaker closing coil via a secondary contact block and a current transducer, and a spring is released to close the circuit breaker, wherein said current transducer measures the circuit breaker closing current required during a closing operation and provides a 4-20 mA output to the programmable logic controller, wherein the contact resistance is defined as a resistance to a current flow when vacuum circuit breaker or air circuit breaker contacts touch one another in a closed condition of the smart circuit breaker tester, and wherein the spring charging current is defined as a current drawn by a spring motor in the circuit breaker to charge springs.

* * * * *